United States Patent
Chen et al.

(10) Patent No.: US 6,562,548 B2
(45) Date of Patent: May 13, 2003

(54) METHOD FOR FABRICATING A MASK READ-ONLY MEMORY

(75) Inventors: Chia-Hsing Chen, Hsinchu (TW); Liu Cheng-Jye, Taoyuan Hsien (TW); Tai-Liang Hsiung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/871,211

(22) Filed: May 31, 2001

(65) Prior Publication Data

US 2002/0155388 A1 Oct. 24, 2002

(30) Foreign Application Priority Data

Apr. 19, 2001 (TW) .................... 90109367 A

(51) Int. Cl.[7] .................. G03C 5/56; H01L 21/8238
(52) U.S. Cl. ................ 430/315; 430/311; 430/320; 430/330; 438/217; 438/291; 438/301
(58) Field of Search ............... 430/311–330; 438/217–301

(56) References Cited

U.S. PATENT DOCUMENTS

| | | | | |
|---|---|---|---|---|
| 5,545,580 A | * | 8/1996 | Sheng et al. | 437/48 |
| 6,077,746 A | * | 6/2000 | You et al. | 438/276 |
| 6,251,731 B1 | * | 6/2001 | Wu | 438/275 |

* cited by examiner

*Primary Examiner*—Mark F. Huff
*Assistant Examiner*—Daborah Chacko-Davis
(74) *Attorney, Agent, or Firm*—J. C. Patents

(57) ABSTRACT

A fabrication method for a mask read-only memory includes forming an oxide layer on a provided substrate. A first mask layer is formed on the oxide layer, followed by performing a first ion implantation to form a plurality of equally spaced bit lines. A thermal process is further conducted to convert the oxide layer to a denser oxide layer. A plurality of word lines, which is perpendicular to the bit lines, is formed on the denser oxide layer. A second mask layer is formed on the plurality of word lines, exposing the channel to be coded. A second ion implantation is conducted on the channel to complete the fabrication of the mask read-only memory device.

17 Claims, 2 Drawing Sheets

METHOD FOR FABRICATING A MASK READ-ONLY MEMORY

CROSS-REFERENCE TO RELATED APPLICATION

This application claims the priority benefit of Taiwan application serial no. 90109367, filed on Apr. 19, 2001.

BACKGROUND OF THE INVENTION

1. Field of Invention

This invention relates to a fabrication method for a semiconductor device. More particularly, the present invention relates to a fabrication method for a mask read-only memory (Mask ROM).

2. Description of Related Art

Because the non-volatile characteristic of the mask read-only memory is able to retain the memory when the power source is interrupted, many electrical products, therefore, are equipped with this type of memory to maintain a normal operation between the "on" and the "off" of these electrical products. The mask read-only memory is one the most fundamental types of the read-only memory. In order to facilitate the fabrication process, the transistor is normally not being removed. Instead, a mask layer is used to determine whether the transistor and the metal line are connected or through an ion implantation process to adjust the threshold voltage to achieve the purpose of controlling the "on" and the "off" of the memory. This type of ion implantation is also known as the code implantation process.

According to the aforementioned fabrication method for a mask read-only memory, a significant modification to the fabrication method is unnecessary even changes are made to the products. This type of fabrication method is thus appropriate for mass production since only the masks are to be modified. As a matter of fact, an intermediate product can be manufactured first. The intermediate product is then programmed upon the receipt of a purchase order to efficiently reduce the delivery time. The new applications for some devices employ other types of memory or logic device in combination with the mask read-only memory, for example an embedded static random access memory (embedded SRAM) in combination with the mask read-only memory to increase the performance of the chip.

FIG. 1 is a schematic, cross-sectional view, showing the manufacturing of a mask read-only memory according to the prior art.

As shown in FIG. 1, an ion implantation is conducted to implant an N-type dopants on a P-type silicon substrate 100 to form a plurality of equally spaced bit lines 102, wherein the space between the bit lines forms the channel region. Thereafter, thermal oxidation is conducted, under various oxidation rates, to form a thicker oxide layer 104a on the bit lines 102 and a thinner oxide layer 104b on the channel region. The thermal oxidation is conducted, for example, approximately at 850 degree Celsius for 30 minutes. A polysilicon layer is further deposited and etched to a defined pattern to form the word lines 106. Subsequently, a programming process is conducted to form a mask layer 108 on the word line 106, exposing the channel region 110 to be coded. An implantation of the P-type or the N-type dopant is conducted, according to the characteristic of the transistor, to complete the code implantation.

According to the conventional approach in forming the mask read-only memory, the thermal oxidation process has to be long enough to grow the oxide layer 104a with a sufficient thickness. Therefore, the distance between the bit lines 102 can not be small in order to prevent the diffusion of dopant of the bit lines 102 during the long thermal oxidation process and to prevent the short channel effect. As a result, the conventional fabrication method can not effectively reduce the distance between the bit lines 102 and increase integration.

SUMMARY OF THE INVENTION

The present invention provides a fabrication method for a mask read-only memory, wherein a gate oxide layer is formed on the provided substrate. A mask layer is then formed on the gate oxide layer, followed by performing an ion implantation to form a plurality of equally spaced bit lines. Thereafter, a thermal process is conducted to convert the oxide layer to a denser oxide layer. A plurality of word lines, which is perpendicular to the bit lines, is then formed on the denser oxide layer. A mask layer is further formed on the plurality of word lines, exposing the channel to be coded. An ion implantation is then conducted to the channel to complete the fabrication of a mask read-only memory.

The present invention provides the formation of an oxide layer on a substrate before the formation of bit lines. An oxide layer with a sufficient thickness is thus formed without a long thermal process. The diffusion of dopant due to the long thermal process, leading to a great bit line junction area is prevented. The problem of not being able to reduce the distance between the bit lines and to increase integration is thereby avoided.

The present invention provides the formation of a gate oxide layer on the substrate, followed by performing a thermal process to form a denser oxide layer. The required processing time is thus greatly reduced to lower the thermal budget.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute as a part of this specification. The drawings illustrate embodiments of the invention and, together with the description, serve to explain the principles of the invention. In the drawings.

DESCRIPTION OF THE PREFERRED EMBODIMENTS

Figure 1:
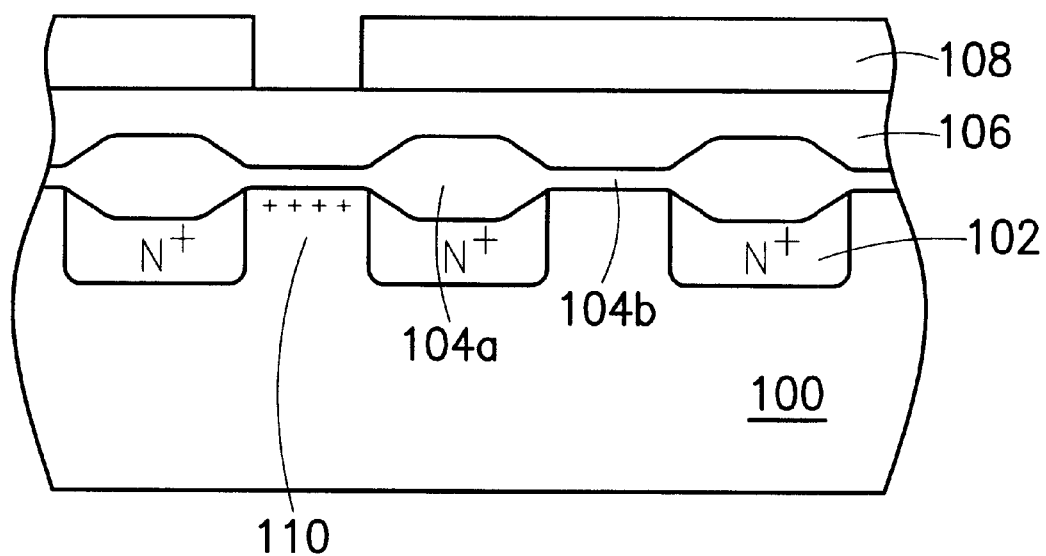
FIG. 1 is a schematic, cross-sectional view, showing the manufacturing of a mask read-only memory according to the prior art.
Figure 2A:
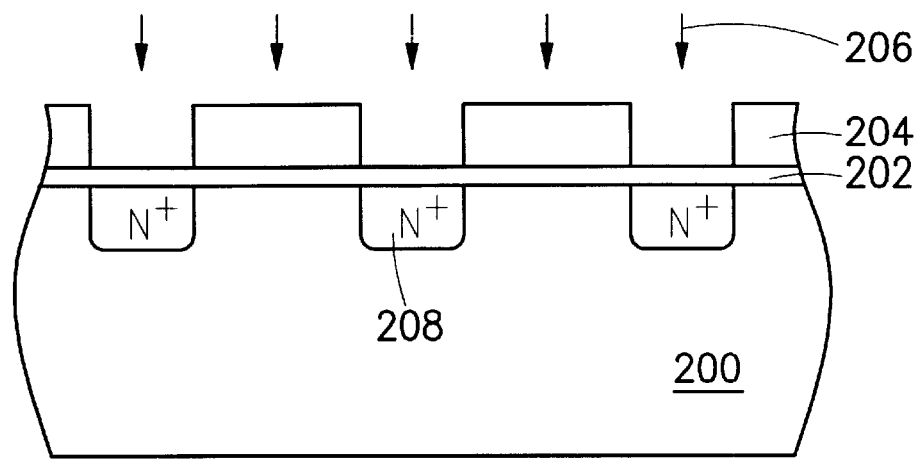
FIGS. 2A–2C are schematic, cross-section views, showing successive steps for the manufacturing of a mask read-only memory according to a preferred embodiment of the present invention.
Figure 2B:
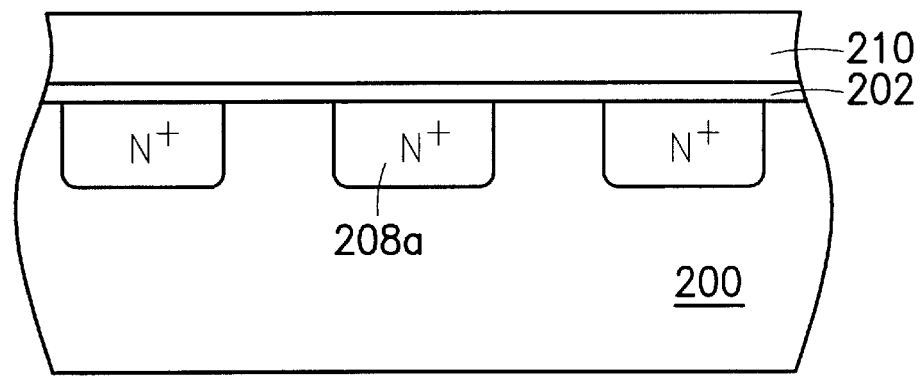
Figure 2C:
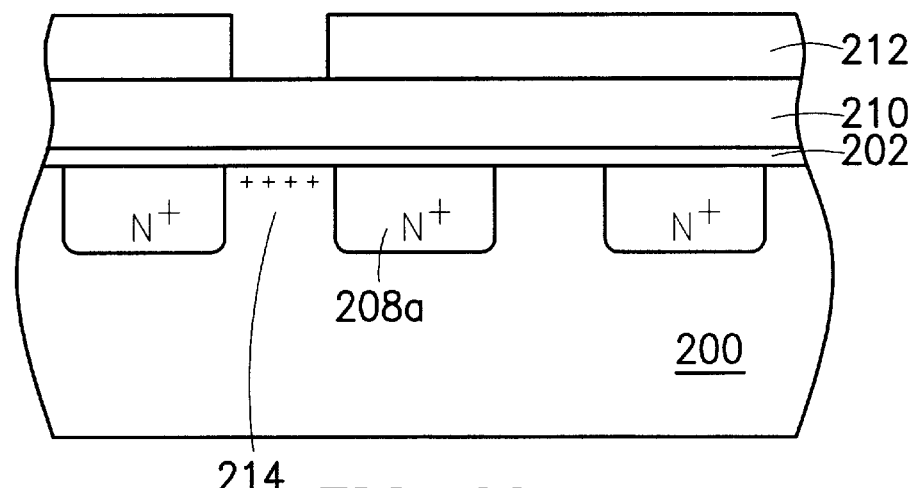

FIGS. 2A–2C are schematic, cross-section views, showing successive steps for the manufacturing of a mask read-only memory according to a preferred embodiment of the present invention.

Referring to FIG. 2A, an oxide layer 202 is formed on a provided substrate 200, wherein the substrate 200 is, for example, a P-type silicon substrate, and the gate oxide layer 202 is, for example, a silicon dioxide layer formed by thermal oxidation. A patterned photoresist layer 204 is then formed on the gate oxide layer 202. Using the patterned photoresist layer 204 as a mask, an ion implantation is conducted to form a plurality of equally spaced bit lines 208. These bit lines are formed by, for example, an implantation of the N type dopant.

Continuing to FIG. 2B, a thermal process is conducted, for example, a rapid thermal oxidation, to form a denser oxide layer and to concurrently cause a minor diffusion of the dopant in the bit lines 208 to form the bit lines 208a.

Since the thermal process in forming the oxide layer with a sufficient thickness is shorter, the area of the dopant diffusion in the bit line 208 to form the bit lines 208a is limited. The distance between the bit lines 208a is greatly reduced and integration is thereby increased.

Thereafter, a word line 210 is formed on the oxide layer 202. The word line 210 is formed by, for example, forming a polysilicon layer on the oxide layer 202 and etching the polysilicon layer to a defined pattern.

Referring to FIG. 2C, the programming of the mask read-only memory is conducted, wherein a mask layer 212 is formed on the word line 210, exposing the channel region 214 to be coded. An ion implantation is conducted on the channel region, for example, implanting a P-type dopant, to complete the code implantation. A different type of dopant is used in the programming process according to the various transistor characteristics.

The present invention provides the formation of the gate oxide layer 202 on the substrate before the formation of the bit lines 208. The duration of the thermal process in forming the oxide layer with a sufficient thickness is short. As a result, the area of the dopant diffusion in the bit lines 208 in forming the bit lines 208a is limited to greatly reduce the distance between the bit lines 208a and to increase integration.

The present invention provides a formation of agate oxide layer 202 on the substrate 200 followed by thermal oxidizing the gate oxide layer 202 to form a denser oxide layer. The required duration of the thermal process is thus greatly decreased to reduce the thermal budget of the manufacturing process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a mask read-only memory, comprising:

providing a substrate;

forming a gate oxide layer on the substrate;

forming a first mask layer on the gate oxide layer, wherein the gate oxide layer has an exposed region not being covered by the first mask layer;

conducting a first ion implantation with dopants by using the first mask layer as a mask to form a plurality of bit lines in the substrate under the exposed region of the gate oxide layer;

performing a thermal process to get the gate oxide layer to be denser and simultaneously to diffuse the dopants to have a width of the bit lines;

forming a plurality of word lines on the gate oxide layer;

forming a second mask layer on the word lines, exposing a channel to be coded; and performing a second ion implantation on the channel.

2. The method of claim 1, wherein the substrate includes a P-type silicon substrate.

3. The method of claim 1, wherein the gate oxide layer is formed by thermal oxidation.

4. The method of claim 1, wherein the thermal process includes a rapid oxidation process.

5. The method of claim 1, wherein the first ion implantation includes implanting an N-type dopant.

6. The method of claim 1, wherein forming the word lines includes:

forming a polysilicon layer on the gate oxide layer; and patterning the polysilicon layer.

7. The method of claim 1, wherein the second ion implantation includes implanting a P-type dopant.

8. The method of claim 1, wherein the second ion implantation includes implanting an N-type dopant.

9. A fabrication method for a mask read-only memory, comprising:

providing a P-type silicon substrate;

forming a gate oxide layer on the P-type silicon substrate;

forming a first mask layer on the gate oxide layer, wherein the gate oxide layer has an exposed region not being covered by the first mask layer;

conducting an N-type dopant ion implantation to form a plurality of bit lines in the substrate within the exposed region of the gate oxide layer, wherein the first mask layer is used as a mask;

conducting a thermal process to get the gate oxide layer to be denser and simultaneously to diffuse the N-type dopant to have a width of the bit lines;

forming a plurality of word lines on the gate oxide layer;

forming a second mask layer on the word lines, exposing a channel to be coded; and performing an ion implantation on the channel.

10. The method of claim 9, wherein the gate oxide layer is formed by a thermal oxidation process.

11. The method of claim 9, wherein the thermal process includes a rapid thermal oxidation process.

12. The method of claim 9, wherein the formation of the bit lines includes:

forming a polysilicon layer on the gate oxide layer; and patterning the polysilicon layer.

13. The method of claim 9, wherein the ion implantation includes implanting a P-type dopant.

14. The method of claim 9, wherein the ion implantation includes implanting an N-type dopant.

15. A method for reducing a bit line junction area, comprising:

providing a substrate;

forming a gate oxide layer on the substrate;

forming a patterned photoresist layer on the gate oxide layer, wherein the oxide layer has an exposed region not being covered by the photoresist layer;

performing an ion implantation with dopants, using the photoresist layer as a mask, to form a plurality of bit lines in the substrate; and performing a thermal process to get the oxide layer to be denser and simultaneously to diffuse dopants to have a width of the bit lines.

16. The method of claim 15, wherein forming the gate oxide layer includes performing a thermal oxidation process.

17. The method of claim 15, wherein the thermal process includes a rapid thermal oxidation process.

* * * * *